United States Patent [19]

Liu

[11] 4,069,579
[45] Jan. 24, 1978

[54] METHOD FOR INSERTING RADIAL LEAD ELECTRONIC COMPONENTS

[76] Inventor: Clark Wen-Hai Liu, No. 25, Alley 8, Lane 18, T'ung-Ho Street, Taipei, China /Taiwan

[21] Appl. No.: 705,342

[22] Filed: July 14, 1976

[51] Int. Cl.² .............................................. H05K 3/30
[52] U.S. Cl. ........................................ 29/626; 29/741; 29/759
[58] Field of Search ................. 29/626, 711, 714, 739, 29/741, 742, 759, 822, 430

[56] References Cited

U.S. PATENT DOCUMENTS

| | | | |
|---|---|---|---|
| 2,873,513 | 2/1959 | Carlzen et al. | 29/741 X |
| 3,508,315 | 4/1970 | Hoffken | 29/741 X |
| 3,740,817 | 6/1973 | Weiler | 29/739 X |

Primary Examiner—Carl E. Hall

[57] ABSTRACT

This invention relates to a high speed machine which can automatically insert radial lead electronic components onto the printed circuit board one-by-one. A combination of such machines installed at a work station can automatically insert many components onto one printed circuit board at the same time. In a similar way, the combination of such machines installed at many work stations can be arranged into a conveyorized assembly line which can automatically insert many components onto many printed circuit boards simultaneously. The apparatus and method for producing this result will significantly save labor in manufacturing electronic equipment.

5 Claims, 13 Drawing Figures

1st station
2nd station
3rd station
Nth station

METHOD FOR INSERTING RADIAL LEAD ELECTRONIC COMPONENTS

BACKGROUND OF THE INVENTION

1. Field of the Invention

This invention relates to an automatic insertion machine and a combination of such machines for inserting radial lead electronic components.

2. Brief Description of the Prior Art

Due to the rapidly increasing worker wages, the shortage of labor, and the attrition of labor in both developed and developing countries, the manufacturing labor cost, together with hiring cost and training cost, have greatly threatened the profitability of manufacturing electronic equipment day by day, such as TV, radio, phonographs, transceivers, etc.

To overcome these problems, there has been conceived a new method and associated equipment developed to automatically insert axial lead type components onto a printed circuit board in the United States. However, this method requires a large investment for reel packing machines, sequence machines, and insertion machines and also additional costs for reel packing the components. So far, only a few leading manufacturers can afford to do so.

Even so, the labor saving of automatically inserting axial lead components has been somewhat offset by the additional cost of requiring more room on the printed circuit board adapted to adopt this type of components.

Hence, the industry has desperately needed a new machine and method to be developed for automatically inserting radial lead components at a reasonable costs so that most manufacturers can afford it.

SUMMARY OF THE INVENTION

The automatic insertion machine according to the present invention comprises an insertion head, a feeding mechanism, frame, magnetic chuck and control system, which can automatically insert various kinds of radial lead electronic components onto the printed circuit board at high speed. The feeding mechanism has a bin big enough to accomodate numerous components good for several hours or even for a whole work shift. The magnetic chuck will simplify machine set up, alignment, and change-over.

In another aspect, this invention provides an application method to combine several such machines at each work station for inserting many components onto one printed circuit board simultaneously. And in a further aspect, the multiplicity of these combinations at several work stations on a conveyorized assmbling line will automatically insert many radial lead components onto many printed circuit boards at the same time. By such insertion machines and the application method, a significant number of labor hours on a printed circuit board assembling line can be saved, and both manufacturing productivity and product quality will be greatly improved.

DESCRIPTION OF THE PREFERRED EMBODIMENT

The insertion machine according to the present invention is capable of handling radial lead components of uniform shape and size and which have two flat sides, such as molded capacitors 11, molded peaking coils 12, intermediate frequency transformers 13, 14, and wound power resistors 15 as shown in FIGS. 1a-1e.

Figure 1A:
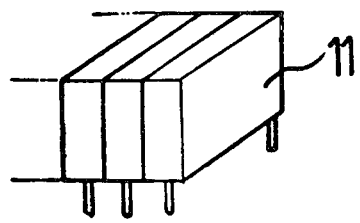
FIGS. 1a-1e are perspective views of examples of radial lead electronic components that are suitable for the automatic insertion method and machine, according to the present invention.
Figure 1B:
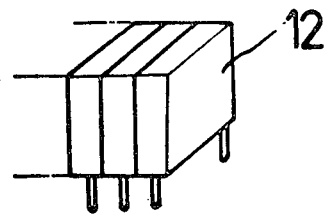
Figure 1C:
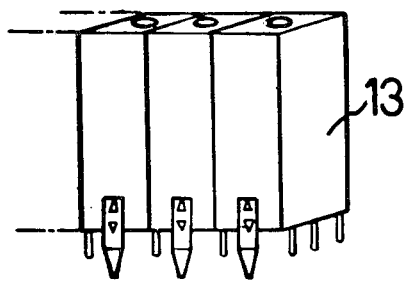
Figure 1D:
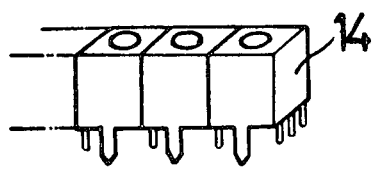
Figure 1E:
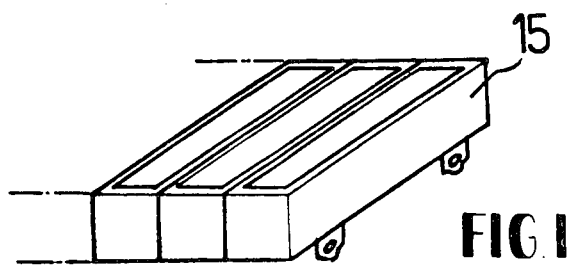
Figure 2:
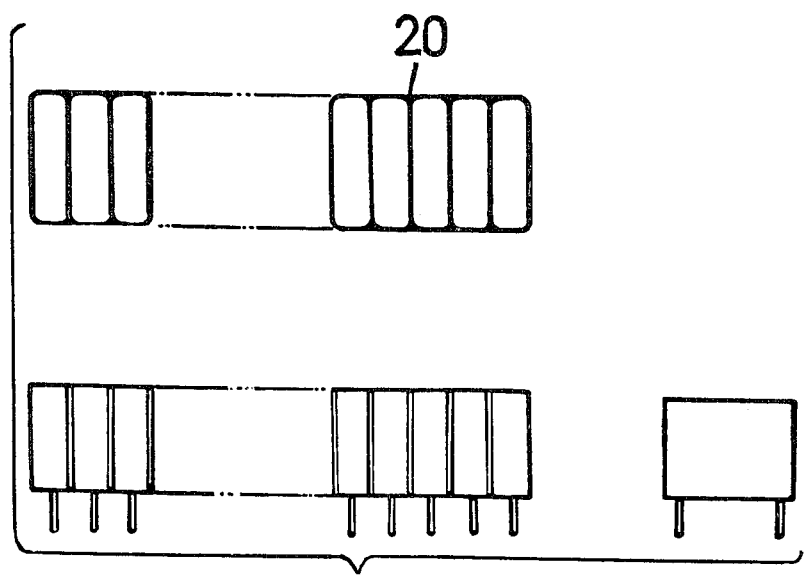
FIG. 2 shows the method of retaining radial leaded components by applying glue.

Referring to FIG. 2, with front, top and side views, the radial leaded components are first stacked into a row 20 by hand or some simple mechanism, then a glue will be applied at the lateral sides of the row (by brushing or dipping). As the glue drys, these components will be retained as a row and are very handy for processing, testing, inspecting, marking, counting, storing and transporting.

The insertion machine according to the present invention comprises an insertion head, a feeding mechanism, a storage bin, a supporting frame (not shown), a magnetic chuck (not shown), driving air cylinders (not shown) and a control system (not shown). Only the outstanding features of the insertion head, feeding mechanism, and storage bin will be fully illustrated, the remaining parts being of common knowledge and will be omitted from the description.

A. SINGLE MACHINE OPERATION

Figure 3A:
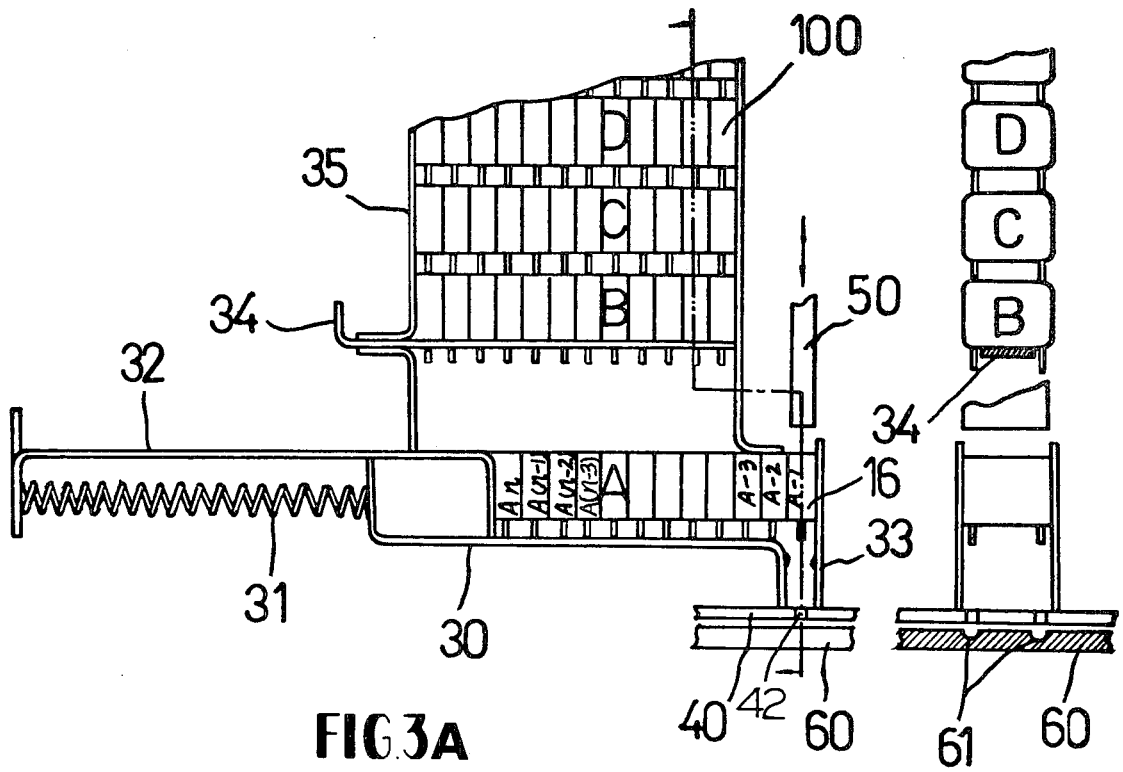
FIGS. 3a-3d show the operation procedure for a single insertion machine, according to the present invention.

Referring to FIG. 3a, the whole row of components 16 are placed on the track 30 of the insertion machine.

The pushing rod 32, pulled by the extension spring 31, pushes against the back (left side) of row A components. The guide 33 is aligned with the holes 42 of printed circuit board 40. With the leads of component A-1 aligned at the center line of the holes, the punch 50 which is driven by a pneumatic cylinder or an electric solenoid, will come down and push component A-1 onto the printed circuit board, i.e., the leads of components A-1 will be inserted into the holes. Then, the punch 50 moves upward, and the pushing rod 32 pushes row A components forward and places component A-2 beneath the punch 50. A new printed circuit board (or new holes) replaces the former. Punch 50 comes down and inserts component A-2. These procedures will be repeated until all rows of components have been inserted onto printed circuit boards.

Figure 3B:
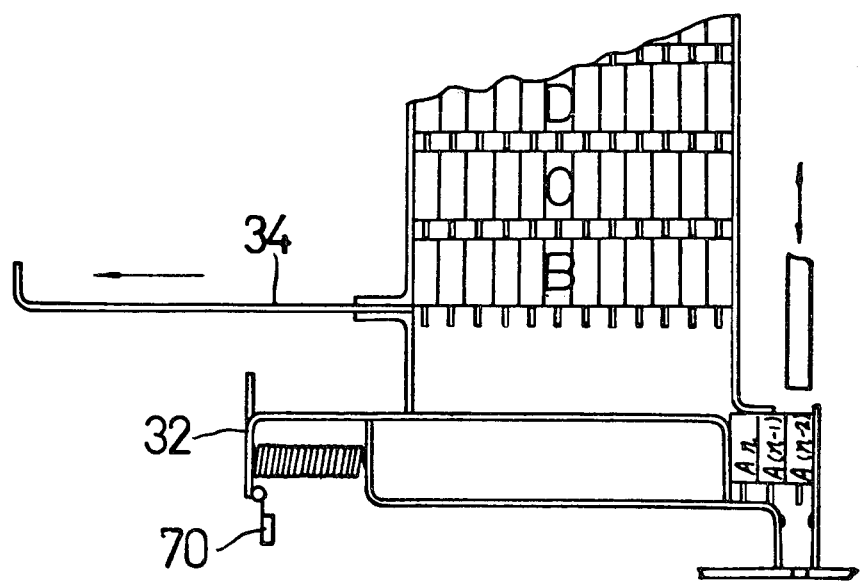
Figure 3C:
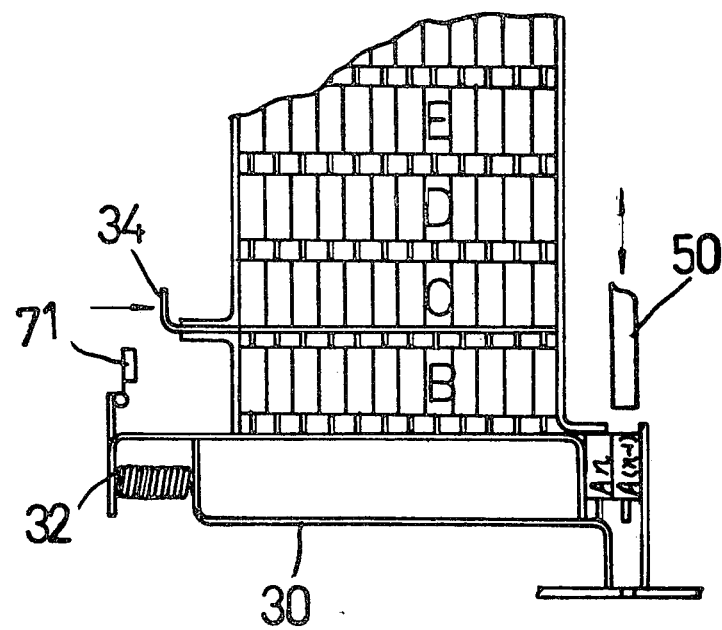

Referring to FIG. 3b, the pushing rod 32 moves forward as punch 50 is inserting components one by one. As soon as the component A (n-3) has been inserted, the pushing rod 32 moves ahead and hits the limit switch (such as micro switch or photo cell) 70. By this signal, the control system immediately commands the driving cylinder (not shown) to pull supporting rod 34 all the way backwards, and components of rows B,C,D, etc. will fall down until row B stands atop of pushing rod 32. Then the supporting rod 34 immediately moves forward and in place beneath components row C as shown in FIG. 3c.

Figure 3D:
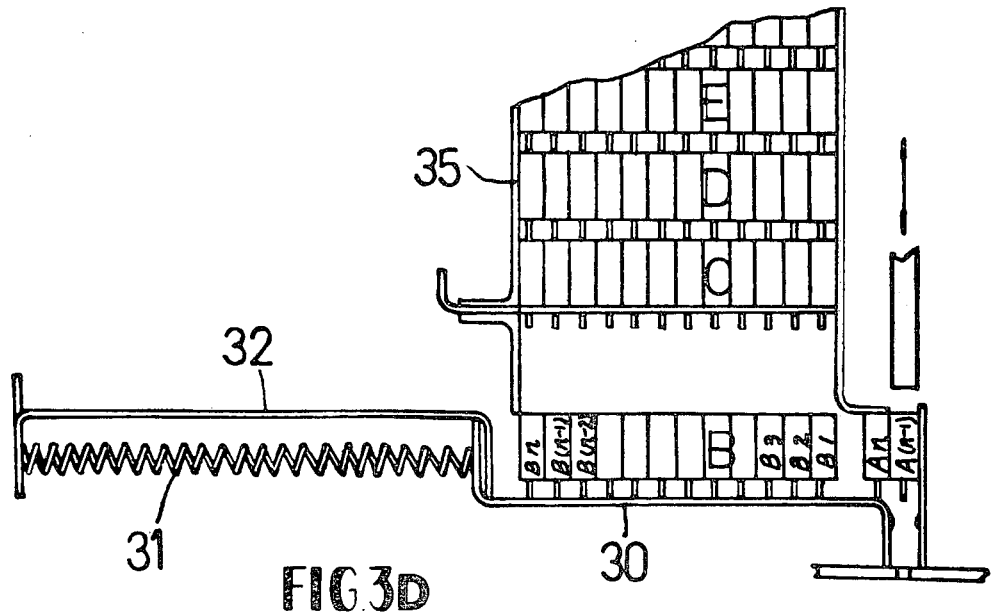

Continuing, punch 50 pushes down component A (n-2) and pushing rod 3 moves one more step ahead and hits the limit switch 71. Similarly, the control system commands the driving cylinder (not shown) to pull pushing rod 32 all way backward and let components row B fall down onto the track 30, as shown in FIG. 3d. The pushing rod 32 is immediately released from the driving cylinder and is again pulled forward by extension spring 31. It then presses against the back of component Bn with component $B_1$ being forced against component An.

By these means, the machine can handle all components in the storage bin 35 one by one by repeating the above described procedures. The storage bin 35 may be constructed so large as to accommodate enough components for the whole shift work, so that no labor is needed to feed components during the shift. Alternatively, it may be large enough for a few hours work and one man could take care of several machines during the shift.

B. THE COMBINATION OF MACHINES AND THE APPLICATION METHOD

For assembling electronic equipments, it has been the conventional method that numerous workers, sitting by both sides of conventional assembling line, pick up components from the storage trays, insert them one by one onto the printed circuit boards that are carried by the conveyor from station to station. The assembled printed circuit boards will finally go through the wave soldering machine for soldering the electric joints.

The key point of the method according to the present invention is to install many machines at each work station of the conveyorized assembling line to replace workers and precisely insert many components simultaneously on many printed circuit boards. This is a revolutionary method for the electronic industry.

The application method will be explained in detail as follows:

1. POSITION AND PILOT

Figure 4A:
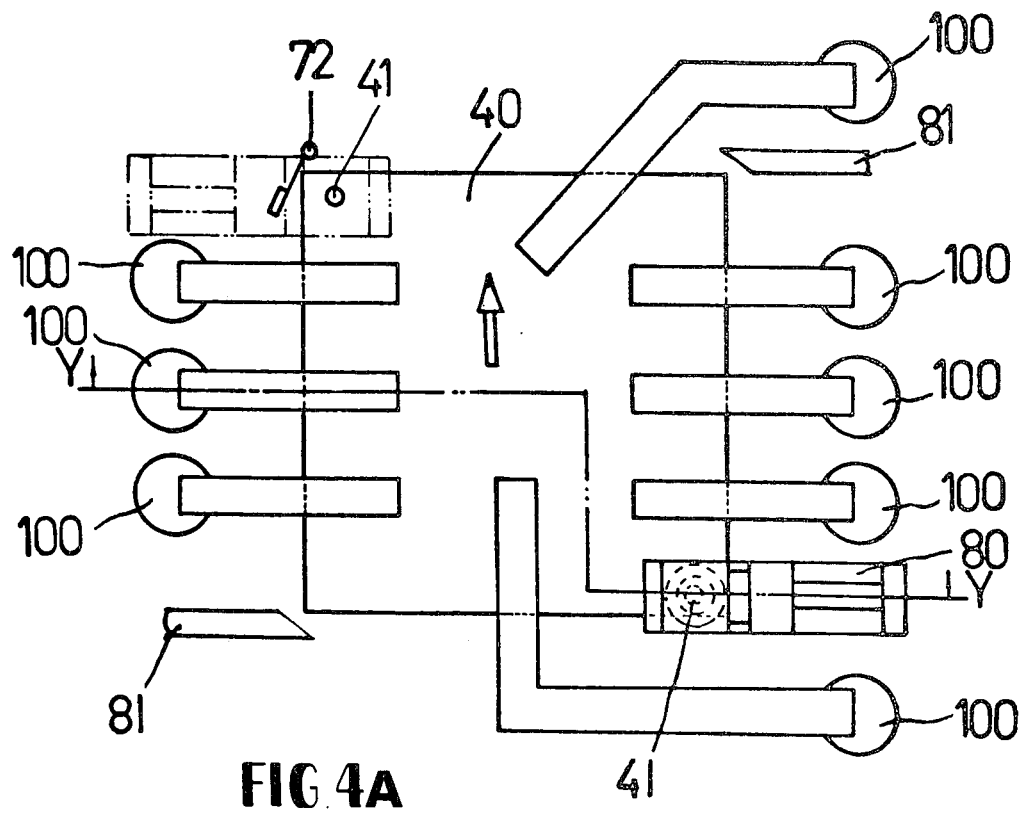
FIGS. 4a and 4b show the layout of a work station equipped with a combination of insertion machines at each work station.

Referring to FIG. 4a, the printed circuit board 40 carried by the conveyor will first hit the limit switch 72 as it arrives at the work station.

Figure 4B:
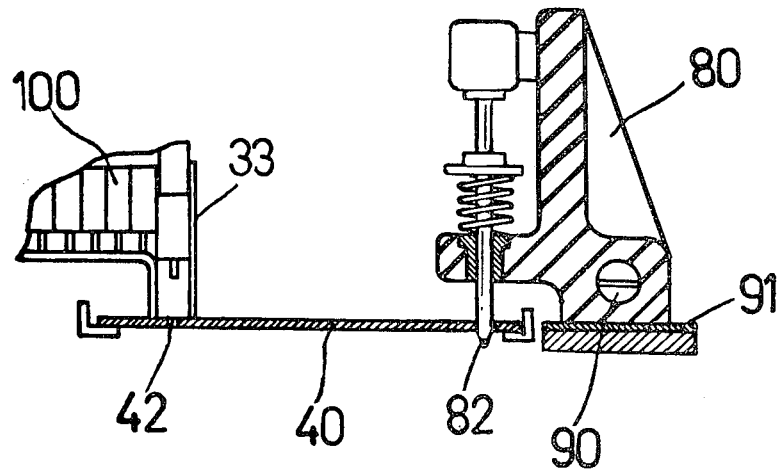

Upon receiving the signal from limit switch 72, the control system will command position slides 81, being driven by pneumatic cylinder. to move forward. The inclined surface at the front ends of these position slides 81 will relocate the printed circuit board and retain it at the exact position desired. Furthermore, the pilot pins 82 (FIG. 4b) of pilot mechanism 80 driven by the pneumatic cylinder, will come down and penetrate through the pilot holes 41 of printed circuit board 40. These procedures will assure placement of the printed circuit board at the exact location desired.

Both position slides 81 and pilot mechanism 80 are constructed with magnetic chucks 90 as the bases. Thus, they can be easily fixed on the table with steel plate coverings. This will facilitate installation and alignment.

2. INSTALLATION AND ALIGNMENT OF INSERTION MACHINES

While the printed circuit board is positioned and piloted as described above, the guide 33 of each insertion machine 100 is prealigned to point at the holes 42 of printed circuit board 40 to insure proper repeated insertion of components. The machine is then fixed on the table by magnetic chuck 90 when a satisfactory insertion result is achieved. Thus, all insertion machines 100 at each work station will be installed and aligned accordingly as shown in FIG. 4a.

3. WHOLE LINE OPERATION

Figure 5:
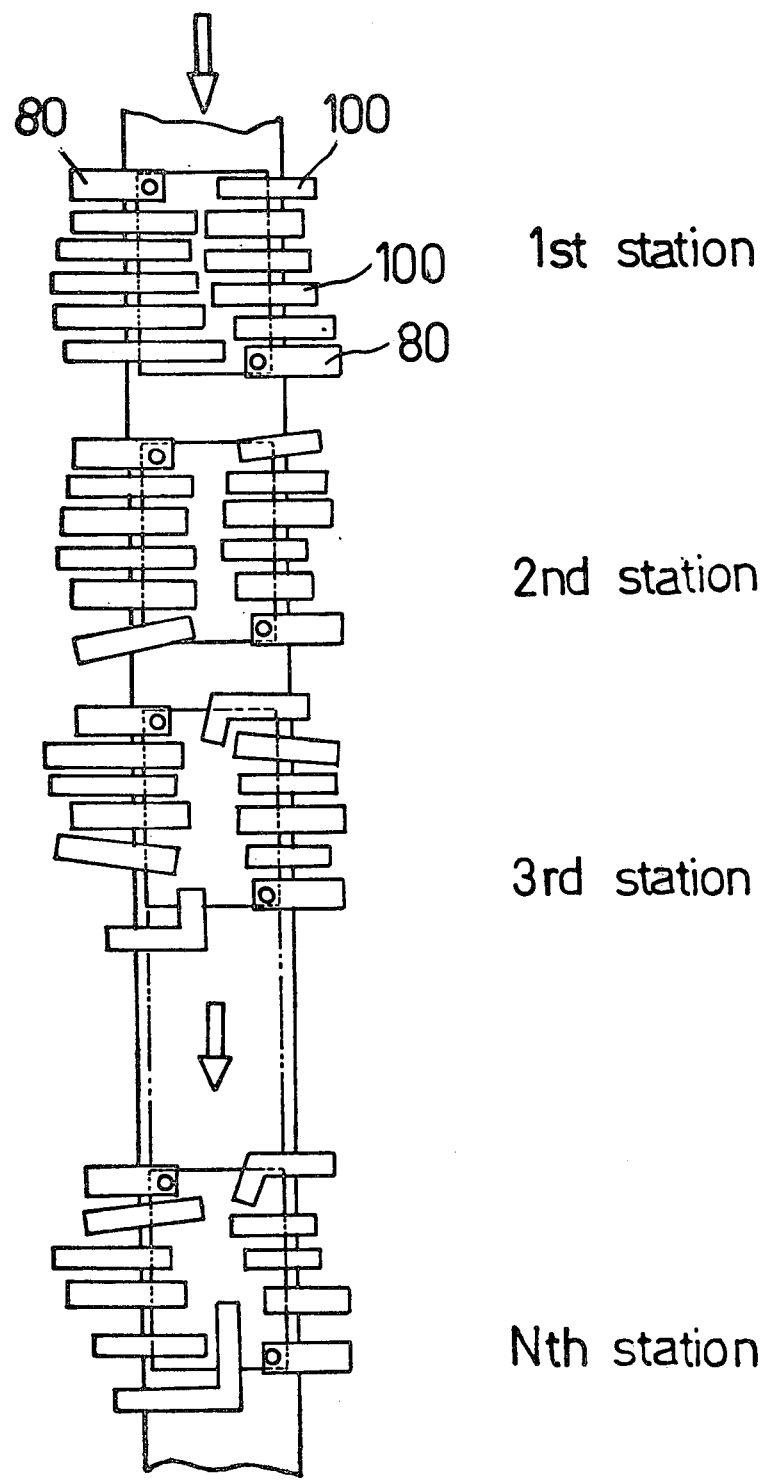
FIG. 5 is a plan view of a series of work stations arranged along a conveyor belt.

Referring to FIG. 5, assuming ten insertion machines have been installed at every work station of a conveyorized assembly line, as soon as the first printed circuit board has arrived at the last station ($n^{th}$ station), the operator can insert 10 × n pieces of components simultaneously in just a few seconds.

If the storage bins of the machines are large enough, no labor or very little labor to take care of the feeding of components is needed. This high speed and labor free insertion method may drastically change the electronic industry.

The outstanding features of this invention are as follows:

1. The feeding mechanism assures continuous and labor free operation.
2. The magnetic chuck of machine facilitates the installation and alignment and renders a great degree of flexibility.
3. The compact and simple machine construction makes it possible to insert many components simultaneously on one printed circuit board. This increases the insertion speed.
4. The position and pilot mechanism makes it easy to convert a conventional assembly line to an automatic insertion one at very low cost.

Conclusively, it is a low cost, but highly flexible and high speed automatic insertion method and system.

What I claim is:

1. A method for inserting radial lead electronic components into printed circuit boards, comprising the steps of:
   filling a storage bin with a plurality of rows of components;
   positioning and piloting a printed circuit board in a predetermined position in relation to the storage bin;
   pushing a first component at the end of a first of the rows of components toward the circuit board, such that the leads of the component penetrate preselected holes in the circuit board;
   subsequently moving the remaining components of the first row toward the end from which the first component was pushed;
   repeating said positioning, pushing and moving steps with further components until a predetermined number of components of the first row remain;
   shifting a second row of said components into place in line with the remaining components of the first row, such that a first component of the second row is adjacent the last component of the first row;
   subsequently transferring the remaining rows toward the second row; and repeatedly performing said repeating, shifting, and transferring steps.

2. A method for inserting radial lead electronic components according to claim 1, wherein the positioning and piloting step is carried out by positioning slides and pilot punches at the edges of the board and through pilot holes on the board, respectively.

3. The method as claimed in claim 1, wherein said steps are simultaneously performed by a plurality of machines at a single work station, each of the machines having its own storage bin, all of the machines simultaneously pushing components into the same circuit board.

4. A method for inserting radial lead electronic components according to claim 3, wherein a plurality of work stations are united together by a conveyor.

5. The method as claimed in claim 1, further comprising the steps of prepositioning the storage bin and related devices in a desired position and securing the bin and devices in position by means of a magnetic chuck.

* * * * *